United States Patent [19]

Noji et al.

[11] 4,041,422
[45] Aug. 9, 1977

[54] FINE TUNING ASSEMBLY FOR PRESET TUNER

[75] Inventors: Tasuku Noji; Yoichi Yasuma, both of Soma, Japan

[73] Assignee: Alps Electric Co., Ltd., Tokyo, Japan

[21] Appl. No.: 707,217

[22] Filed: July 21, 1976

[30] Foreign Application Priority Data

July 25, 1975 Japan ............................. 50-103274

[51] Int. Cl.$^2$ ............................................. H03J 5/28
[52] U.S. Cl. .................................... 334/49; 74/10.15; 74/10.8; 74/384; 334/51; 334/57
[58] Field of Search ................ 325/453, 465; 334/48, 334/49, 51, 57, 74; 74/10.15, 10.41, 10.8, 10.85, 384

[56] References Cited

U.S. PATENT DOCUMENTS

| | | | |
|---|---|---|---|
| 3,148,345 | 9/1964 | Moran | 334/51 |
| 3,175,407 | 3/1965 | Reinwall, Jr. | 334/51 X |
| 3,248,674 | 4/1966 | Fulton | 334/51 |
| 3,898,879 | 8/1975 | Cappelle et al. | 334/51 X |

*Primary Examiner*—Paul L. Gensler
*Attorney, Agent, or Firm*—Guy W. Shoup

[57] ABSTRACT

A plurality of fine tuning elements are mounted on a disc which is rotatable by a selector shaft so that a selected tuning element is in a tuning position. Each tuning element comprises a screw with a gear mounted at the end thereof. A tuning shaft is rotatable and translatable on the selector shaft and has an actuator disc and a tuning gear fixed thereto. An idler shaft has first and second gears fixed thereto and is normally held in a tilted inoperative position by a spring. The tuning shaft is manually translatable so that the actuator disc engages with the idler shaft and tilts the same against the force of the spring in such a manner that the first and second gears engage with the tuning gear and the gear of the selected tuning element respectively to drivably connect the tuning shaft to the screw of the desired tuning element.

6 Claims, 8 Drawing Figures

4,041,422

FINE TUNING ASSEMBLY FOR PRESET TUNER

BACKGROUND OF THE INVENTION

The present invention relates to a fine tuning assembly for a preset tuner of the type used in a VHF television receiver.

It is currently popular to provide VHF television receivers with preset fine tuning operation. Upon installation of the television receiver in the viewer's home, the receiver is fine tuned to each channel by a simple operation, and in normal viewing areas it is unnecessary to fine tune the receiver again. This system represents a considerable improvement in convenience of operation over the old system in which the receiver must be fine tuned each time the channel is changed. The preset system also facilitates the incorporation of remote control channel selection, since the need for fine tuning is eliminated.

However, preset fine tuners have heretofore been complex in construction, and therefore rather expensive. In addition, the amount of force required to operate the controls for the initial fine tuning preset operation has been excessive.

SUMMARY OF THE INVENTION

It is an object of the present invention to provide a fine tuning assembly for a preset tuner which is simpler in construction and therefore less expensive to commercially produce than known assemblies.

It is another object of the present invention to provide a fine tuning assembly in which the force required to operate the fine tuning preset controls is considerably less than that of known tuning assemblies.

It is another object of the present invention to provide a fine tuning assembly comprising a tiltable idler shaft to connect or disconnect a tuning shaft and a fine tuning element.

It is another object of the present invention to provide a generally improved fine tuning assembly for a preset tuner.

Other objects, together with the foregoing, are attained in the embodiments described in the following description and illustrated in the accompanying drawings.

DESCRIPTION OF THE PREFERRED EMBODIMENTS

While the fine tuning assembly of the present invention is susceptible of numerous physical embodiments, depending upon the environment and requirements of use, substantial numbers of herein shown and described embodiments have been made, tested and used, and all have performed in an eminently satisfactory manner.

Figure 1:
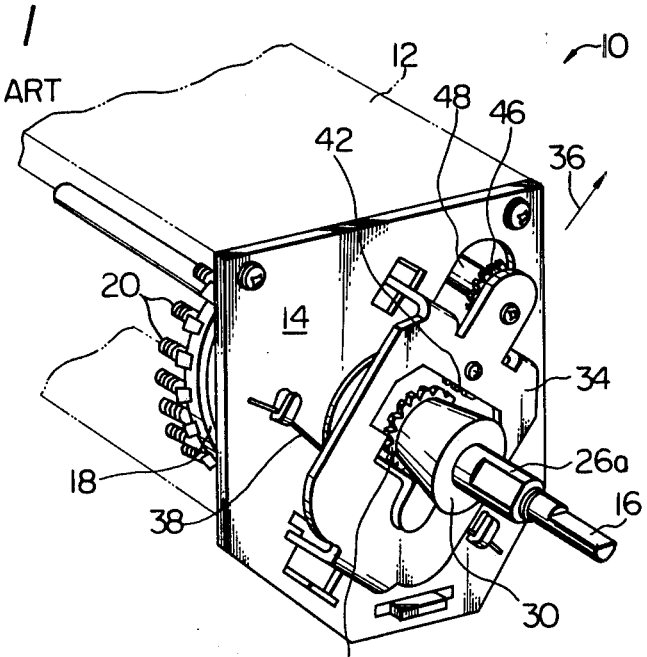
FIG. 1 is a perspective view of a prior art preset tuning assembly.
Figure 2:
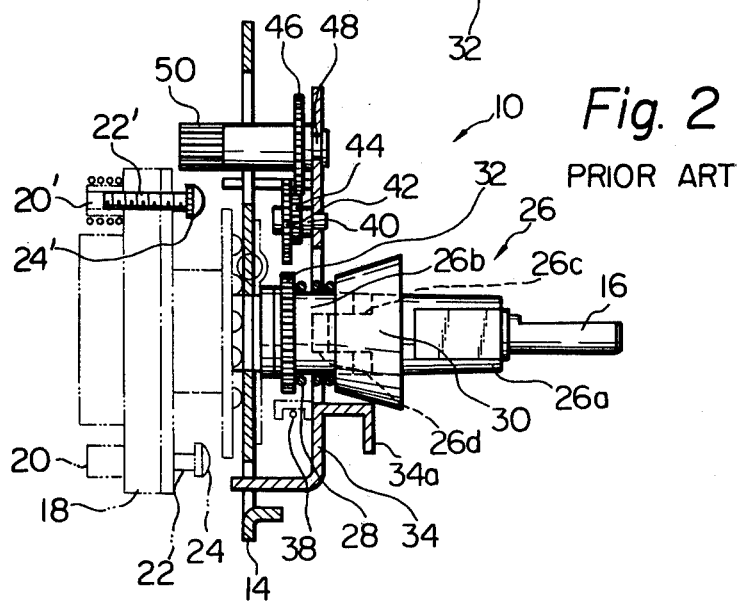
FIG. 2 is a sectional side elevation of the tuning assembly shown in FIG. 1 in a disengaged position.
Figure 3:
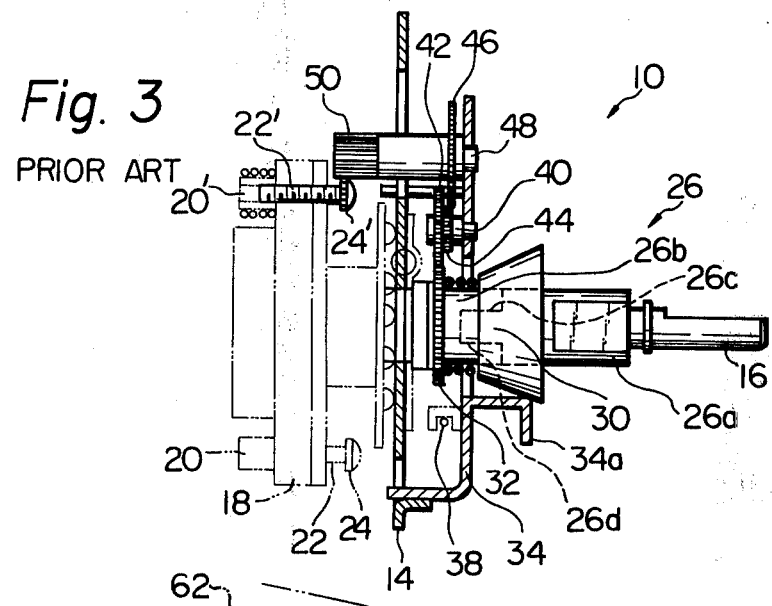
FIG. 3 is similar to FIG. 2 but shows the tuning assembly in an engaged position.

Referring in combination to FIGS. 1 to 3, a prior art fine tuning assembly 10 for a preset tuner of the VHF television receiver type comprises a frame 12 having an end plate 14. A channel selector shaft 16 is rotatably supported by the end plate 14, and a disc 18 is fixed to the selector shaft 16 for unitary rotation. A plurality of tuning elements 20 are mounted on the disc 18 in a cylindrical arrangement, each tuning element 20 comprising a rotary shaft or screw 22 and a gear 24 fixed to the end thereof. The tuning elements 20 may be inductive, capacitive or resistive in accordance with the particular television receiver in which the tuning assembly 10 is incorporated, and rotation of the screws 22 results in variation of the local oscillator frequency. A tuning element 20 is provided for each VHF channel.

The selector shaft 16 is rotatable to move the tuning element corresponding to the selected channel, here designated as 20', into a tuning position as shown. The disc 18 constitutes part of a switch, which is not shown for a simplicity of illustration, which connects the selected tuning element 20' to the television tuning circuit, also not shown, in a known manner.

When the television receiver is first installed in the viewer's home, it is necessary to rotate the tuning elements 20 to the proper positions such that the respective channels will be correctly fine tuned. This operation need only be performed once. In order to accomplish this function, the prior art fine tuning assembly 10 comprises a fine tuning shaft 26 which is rotatably, translatably coaxially supported by the selector shaft 16. The tuning shaft 26 comprises two sections, 26a and 26b which are translatably connected together by means of a tongue 26c formed on the section 26a and a slot 26d formed in the section 26d. The sections 26a and 26b therefore are rotatable in a unitary manner. The section 26b is rotatably mounted on the end plate 14 and is held against translation. The section 26a is translatable relative to the section 26b and is urged rightwardly by a compression spring 28. A frustro-conical actuator member 30 is fixed to the section 26a and a gear 32 is fixed to the section 26b.

A retaining plate 34 is translatably retained by the end plate 14 and is urged in the direction of an arrow 36 by a spring 38 to a disengaged position shown in FIGS. 1 and 2. An idler shaft 40 is rotatably supported by the retaining plate 34 and its integral with a first gear 42 which is engagable with the tuning gear 32 and a second gear 44 which meshes with a third gear 46 which is integral with another idler shaft 48 which is rotatably supported by the retaining plate 34. A pinion 50 is integral with the idler shaft 48 and is engagable with the gear 24' of the selected tuning element 20'. The retaining plate 34 is formed with a tongue 34a which is engagable with the actuator member 30.

The tuning assembly is shown in a normal or disengaged position in FIGS. 1 and 2. Specifically, the gear 42 is disengaged from the gear 32 and the pinion 50 is disengaged from the gear 24' of the selected tuning element 20'. Rotation of the tuning shaft 26 therefore has no effect on any of the tuning elements 20.

FIG. 3 shows the tuning assembly 10 in the engaged position. To drivably connect the tuning shaft 26 to the shaft 22' of the selected tuning element 20' to accomplish fine tuning of the respective selected channel, the television viewer or service personnel pushes the section 26a of the tuning shaft 26 leftwardly as viewed in FIG. 3. The actuator member 30 engages with the tongue 34a of the retaining plate 34 thereby moving the retaining plate 34 in the direction opposite to the arrow 36 so that the gear 42 engages with the gear 32 and the pinion 50 engages with the gear 24' of the selected tuning element 20'. In this manner, rotation of the section 26a will produce rotation of the gear 24' through the section 26b, gear 32, gear 42, shaft 40, gear 44, gear 46, shaft 48 and pinion 50, thereby allowing the fine tuning for the respective channel to be performed by rotation of the section 26a of the tuning shaft 26.

After the fine tuning for one channel is completed, the section 26a is released and the tuning assembly 10 is restored to the disengaged position of FIGS. 1 and 2 by the springs 28 and 38. The selector shaft 16 is then rotated to move the next tuning element 20 into the tuning position. This operation is performed for each of the channels.

It will be noticed that the construction of the prior art tuning assembly 10 is quite complex, especially since it comprises a large number of parts such as the retaining plate 34 and many gears. In addition, an inordinate amount of force is required to push the section 26a of the tuning shaft 26 to engage the various gears sufficiently to perform fine tuning since the operation must be performed against the forces of the springs 28 and 38. The spring 38 is necessarily strong since it must bias the retaining plate 34, which is manufactured by metal die casting in practice, to the inoperative position. This complicated prior art tuning assembly 10 is necessarily expensive to commercially produce.

Figure 4:
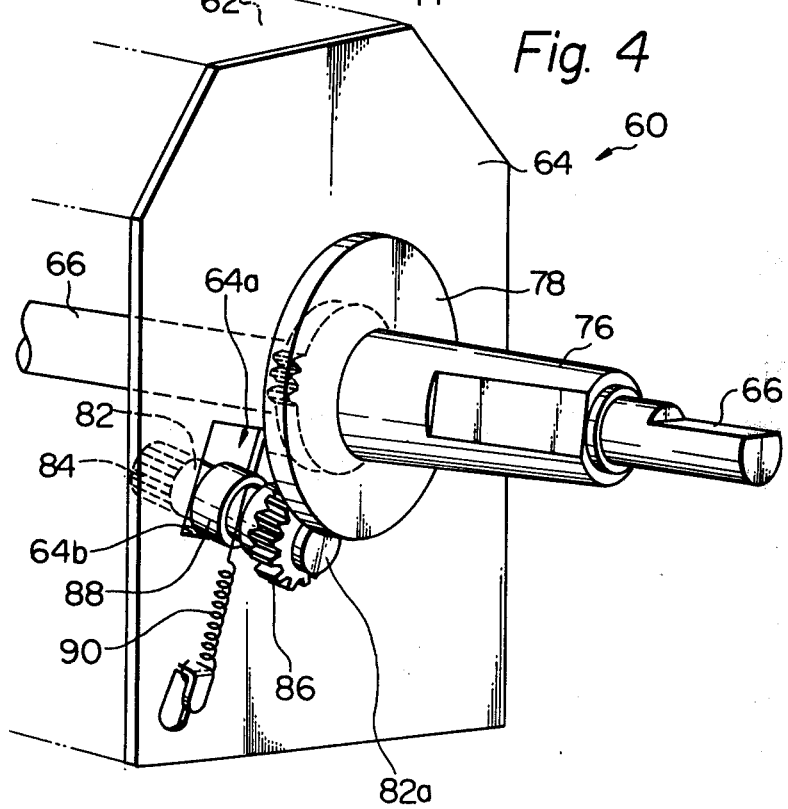
FIG. 4 is a perspective view, partly in section, of a fine tuning assembly embodying the present invention.
Figure 5:
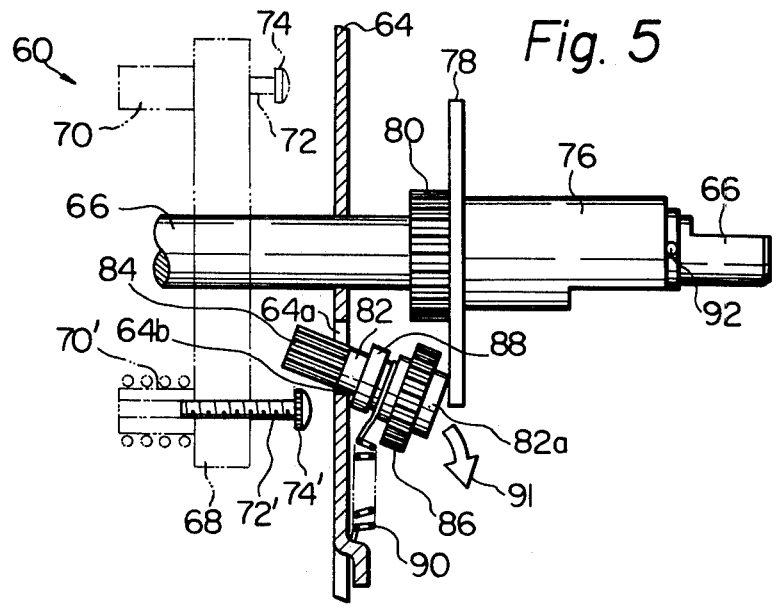
FIG. 5 is a sectional side elevation of the tuning assembly shown in FIG. 4 in a disengaged position.
Figure 6:
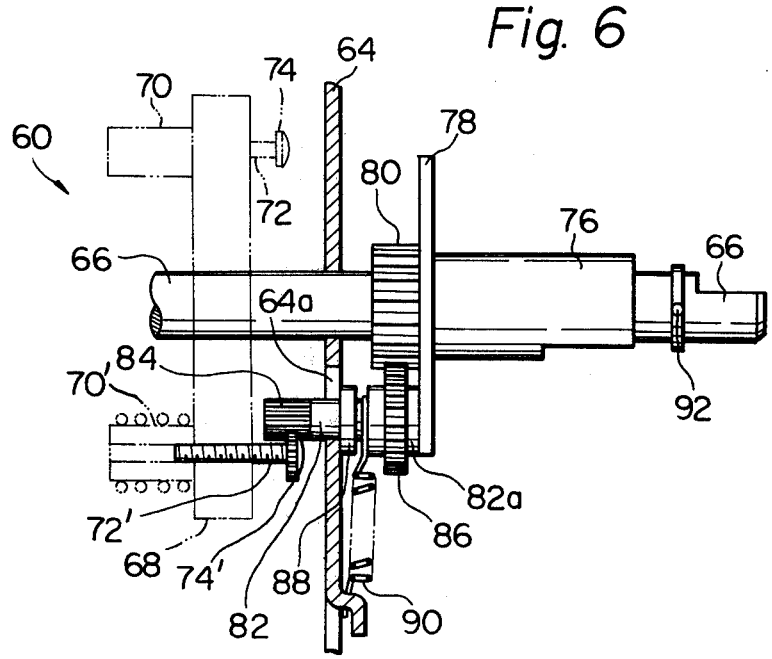
FIG. 6 is similar to FIG. 5 shows the tuning assembly in an engaged position.

The drawbacks of the prior art tuning assembly 10 are overcome in a tuning assembly 60 embodying the present invention which is illustrated in FIGS. 4 to 6. The tuning assembly 60 comprises a frame 62 having an end plate 64. A channel selector shaft 66 is rotatably supported by the end plate 64 and a support disc 68 is fixed to the shaft 66. A plurality of tuning elements 70 which may be of the inductive, capacitive or resistive type are mounted on the disc 68 in a cylindrical configuration. The selector shaft 66 is rotatable to move a selected one of the tuning elements 70 which is designated as 70' into a tuning position as shown. Each tuning element 70 comprises a shaft or screw 72 having a gear 74 fixed to the end thereof which varies the local oscillator frequency of the respective channel when rotated.

A tuning shaft 76 is rotatably, translatably coaxially supported by the selector shaft 66 and has an actuator disc 78 and a tuning gear 80 fixed thereto. An idler shaft 82 rotatably extends through a rectangular opening 64a formed through the end plate 64, the opening 64a having a width equal to the diameter of the idler shaft 82. A pinion 84 is integral with the left end of the idler shaft 82 and is engagable with a gear 74' fixed to a screw 72' of the selected tuning element 70'. A shoulder 88 is formed on the idler shaft 82 between a gear 86 integral with the idler shaft 82 and the pinion 84 the gear 86 being engagable with the tuning gear 80. The idler shaft 82 is tiltable on an edge 64b of the opening 64a in the end plate 64 and is urged to tilt to a disengaged position shown in FIG. 5 by a tension spring 90 connected between the end plate 64 and the idler shaft 82 between the shoulder 88 and the gear 86 to apply a downward force to the idler shaft 82 substantially perpendicular thereto. The spring 90 causes the idler shaft 82 to tilt clockwise in FIG. 5 as shown by an arrow 91 so that the pinion 84 disengages from the gear 74' and the gear 86 disengages from the gear 80. The right end 82a of the idler shaft 82 engages with the actuator disc 78 and urges the disc 78 and tuning shaft 76 rightwardly until the right end (no numeral) of the tuning shaft 76 abuts against a stopper pin 92 fixed to the selector shaft 66. The distance between the actuating plate 78 and the end plate 64 in this position is selected so that the idler shaft 82 will not be allowed to tilt sufficiently to disengage from the actuator disc 78 and end plate 64.

To accomplish fine tuning, the tuning shaft 76 and actuator disc 78 are pushed leftwardly to the position of FIG. 6. The leftward movement of the actuator disc 78 causes the idler shaft 82 to tilt opposite to the arrow 91 to a horizontal position substantially parallel to the screw 72' and tuning shaft 76 in which the gear 86 engages with the gear 80 and the pinion 84 engages with the gear 74'. The shoulder 88 abuts against the right side of the end plate 64 thereby holding the idler shaft 82 in the position of FIG. 6. Rotation of the tuning shaft 76 results in rotation of the screw 72' through the gear 80, gear 86, idler shaft 82 and pinion 84, thereby allowing fine tuning of the channel corresponding to the selected tuning element 70' through rotation of the tuning shaft 76. Upon release of the tuning shaft 76, the idler shaft 82 and tuning shaft 76 are returned to the positions shown in FIG. 5 by the spring 90. This operation is performed for each channel as described above.

Figure 7:
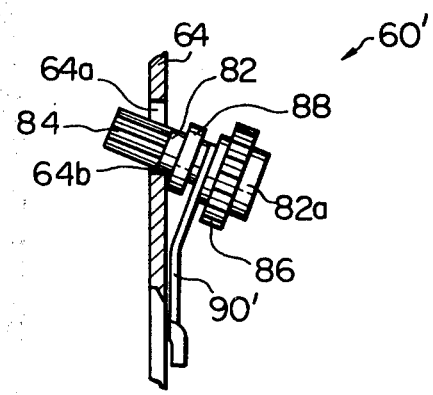
FIG. 7 is a fragmentary sectional side elevation illustrating a first modification of the fine tuning assembly shown in FIG. 4.

FIG. 7 illustrates a modification of the tuning apparatus 60 which is designated as 60' and differs only in that the tenison spring 90 is replaced by a leaf spring 90' connected between the end plate 64 and the idler shaft 82.

Figure 8:
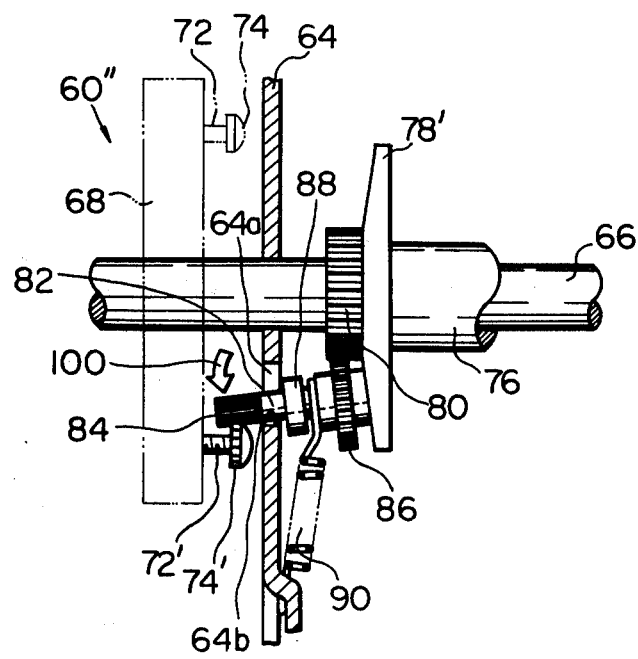
FIG. 8 is a fragmentary side elevation illustrating a second modification of the tuning assembly shown in FIG. 4.

FIG. 8 illustrates another modification of the tuning apparatus 60 which is designated as 60" and differs only in that the actuator disc 78 is replaced by a modified actuator disc 78' having a frusto-conical shape. The disc 78' causes the idler shaft 82 to tilt in the direction of an arrow 100 beyond the horizontal position to forceably engage the pinion 84 with the gear 74' and the gear 86 with the gear 80.

It will be understood from the foregoing that the tuning assembly 60 of the present invention is extremely advantageous over the prior art tuning assembly 10 and other known tuning assemblies of similar construction. The present tuning apparatus 60 comprises only a few parts, is therefore inexpensive to manufacture and provides reliable operation with a minimum amount of applied force.

What is claimed is:
1. A tuning assembly comprising:
a frame;
a channel selector shaft rotatably supported by the frame;
a support member fixed to the selector shaft;
a plurality of tuning elements mounted on the support member, each tuning element including a rotary shaft and a gear fixed to the rotary shaft, the selector shaft being rotatable to move a selected one of the tuning elements to a tuning position;
a tuning shaft rotatably and translatably supported by the frame;

a tuning gear and an actuator member fixed to the tuning shaft;

an idler shaft rotatably supported by the frame;

first and second idler gears fixed to the idler shaft and engagable with the tuning gear and the gear of said selected tuning element respectively; and biasing means urging the idler shaft to tilt over an edge of the frame so that the first and second idler gears disengage from the tuning gear and the gear of said selected tuning element respectively, the tuning shaft being translatable so that the actuator member engages with the idler shaft and tilts the idler shaft against a force of the biasing means so that the first and second gears drivably engage with the tuning gear and the gear of said selected tuning element respectively.

2. A tuning assembly as in claim 1, further comprising a shoulder formed on the idler shaft arranged to abut against the frame when the idler shaft is tilted through translation of the tuning shaft to engage the first and second gears with the tuning gear and the gear of said selected tuning element respectively.

3. A tuning assembly as in claim 1, in which the biasing means comprises a tension spring connected between the idler shaft and the frame to apply said force substantially perpendicular to the idler shaft.

4. A tuning assembly as in claim 1, in which the biasing means comprises a leaf spring connected between the frame and the idler shaft.

5. A tuning assembly as in claim 1, in which the actuator member is formed with a frusto-conical surface for engagement with the idler shaft.

6. A tuning assembly as in claim 1, in which the actuator member is engagable with an end of the idler shaft.

* * * * *